July 7, 1953 W. C. DUNLAP, JR 2,644,852

GERMANIUM PHOTOCELL

Filed Oct. 19, 1951

Inventor:
William C. Dunlap, Jr.
by Paul A. Frank
His Attorney.

Patented July 7, 1953 2,644,852

UNITED STATES PATENT OFFICE 2,644,852

GERMANIUM PHOTOCELL

William C. Dunlap, Jr., Schenectady, N. Y., assignor to General Electric Company, a corporation of New York Application October 19, 1951, Serial No. 252,139

12 Claims. (Cl. 136—89)

Figure 1:
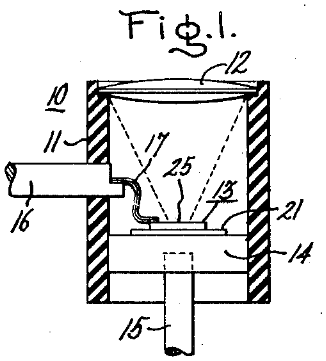

My invention relates to photosensitive devices, and more particularly to photocells employing germanium as the photosensitive element thereof.

It is well known that if light is directed upon a region of contact between the point of a pointed electrode and the surface of a piece of germanium, a photoelectric effect is observed which may be evidenced by the presence of a photoelectric voltage between the point contacting electrode and the germanium piece or by a photocontrol of an electric current previously established therebetween. Because of the small area of the photosensitive germanium surface surrounding the point of electrode contact, the magnitude of this photoelectric effect is correspondingly small, and difficulties are encountered in providing suitable optical means for concentrating the incident light upon this sensitive region of electrode point contact.

It has also become known that germanium P-N junction units exhibit a similar photoelectric effect between the P-type and N-type regions of the unit when light impinges upon the P-N junction. The term "germanium P-N junction unit" is commonly employed in the art and is used in this application to define a germanium unit having a region of P-type germanium, an adjacent region of N-type germanium, and an intermediate joining layer or region, called a "P-N junction." N-type germanium is germanium having "negative" conduction characteristics usually resulting from a predominance of negative sign conduction carriers in the germanium over positive sign conduction carriers. Conversely, P-type germanium is germanium having "positive" conduction characteristics usually resulting from a predominance of positive sign conduction carriers over negative sign conduction carriers therein. Excess electrons constitute the principal negative sign conduction carriers, while electron vacancies, commonly called "positive holes," constitute the principal positive sign conduction carriers. N-type germanium usually results from the presence of minute quantities of one type of significant impurity such as antimony, phosphorus, and arsenic, called "donors," having a higher valence than germanium, which function to donate or furnish excess electrons to the germanium material. P-type germanium, on the other hand, usually results from the presence of minute quantities of a second type of significant impurity such as aluminum, gallium, and indium, called "acceptors," having a lower valence than germanium, which function to absorb electrons to produce electron vacancies in the germanium material. In order to obtain germanium P-N junction units exhibiting useful photoelectric characteristics, it is desirable to employ substantially pure germanium initially having a resistivity of at least 2 ohm centimeters, corresponding to germanium having only very minute quantities of such conduction carrier inducing impurities.

The photosensitive P-N junctions in such units can be made to cover a much greater area than the photosensitive region surrounding a point contacting electrode, and the potential photoelectric effects theoretically obtainable from such P-N junction units are thus far greater than that obtainable from point contacting devices. Several difficulties, however, have heretofore prevented the full realization of the greater photoelectric effects inherent in such P-N junctions. For example, the P-type and N-type germanium regions on either side of the junction have generally been of appreciable thickness. Due to the high impedance of germanium to the transmission of light rays, especially light lying in the visible and ultra-violet portion of the spectrum, it has been deemed feasible only to illuminate an exposed edge of the P-N junction from a direction substantially parallel to the plane of the junction. Under this condition, only the illuminated P-N junction edge is the principal contributor to the total resulting photoelectric effect, and the greater reservoir of photosensitivity potentially available over the entire broad area of the P-N junction remains untapped.

Accordingly, a principal object of my invention is to provide an improved germanium photocell of the P-N junction type which has a greater active photosensitive area than germanium point contact type photocells or conventional edge illuminated P-N junction type germanium photocells.

Another object of my invention is to provide a P-N junction type photocell which responds to light throughout the infra-red, visible, and ultra-violet range of the spectrum, even though light is passed through a portion of the germanium before it reaches the internal P-N junction.

Another object is to provide a photocell that is selectively responsive to predetermined narrower bands of the light spectrum, particularly the infra-red band.

A further object of my invention is to provide a P-N junction type photocell which has an economical and sturdy construction despite the small size and inherent fragility of the active germanium unit.

A still further object of my invention is to provide a germanium P–N junction type photocell including a simplified and highly effective means for concentrating light upon the P–N junction.

In general, my improved photocell includes a germanium P–N junction unit in the form of a wafer having an overall thickness no greater than .050 inch in which the P–N junction is formed as an internal layer substantially parallel to the two major surfaces of the wafer. The length and width of the wafer are not critical, a length and width in the neighborhood of ¼ inch being convenient. Suitable methods for making such germanium P–N junction units form a portion of the subject matter of my copending application, Serial No. 187,490, filed September 29, 1950, and of an application Serial No. 187,478, filed September 29, 1950, by R. N. Hall, both applications being assigned to the present assignee. Separate electrodes are respectively connected to the P-type and N-type regions on opposite sides of the P–N junction, and means are provided for directing light through either the P-type or N-type region to impinge upon the broad area of the internal P–N junction from a direction substantially perpendicular to the plane of the junction. The position of the internal P–N junction layer along the wafer thickness dimension as well as the overall thickness of the wafer may be adjusted during manufacture of the unit, so that the unit responds to the entire light spectrum including the ultra-violet and infra-red portions thereof, or to narrower bands of the light spectrum approaching the infra-red.

In a preferred form of my invention, a very thin film of a conduction carrier inducing impurity is deposited as a layer or as a grid upon one face of the germanium wafer, and the P–N junction is formed immediately beneath this impurity film by effecting an alloying and diffusion of the impurity into the germanium wafer to a depth of penetration less than .001 inch. The controlling light is made incident upon the impurity film and passes through the film to excite this adjacent P–N junction underneath without appreciable attenuation of any wave length.

In an alternative arrangement, the controlling light is made incident upon the opposite major face of the germanium so that the light passes through practically the entire thickness of the wafer before reaching the P–N junction layer. Because of the high absorptivity of germanium to light having a shorter wave length than infra-red light, such photocells are sensitive primarily to infra-red light and may be used to detect or filter infra-red light from the remainder of the light spectrum. The degree of sensitivity to visible and ultra-violet light is determined by the depth of germanium material through which the incident light passes before reaching the P–N junction, and may be controlled during manufacture by the depth at which the P–N junction is formed or by reducing the thickness of the wafer, such as by grinding or etching, after the junction has been formed.

Where the incident light passes through an appreciable depth of germanium before reaching the P–N junction, I have found that the light may be focused or concentrated upon the internal junction by shaping the light-receiving surface of the germanium wafer so that the wafer itself functions as an efficient lens due to its high index of refraction.

Figure 2:
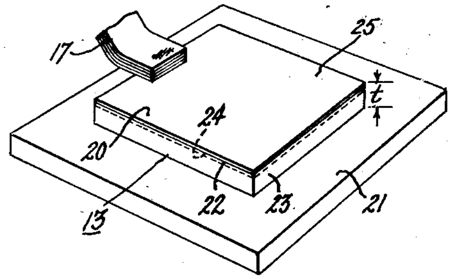
Figure 3:
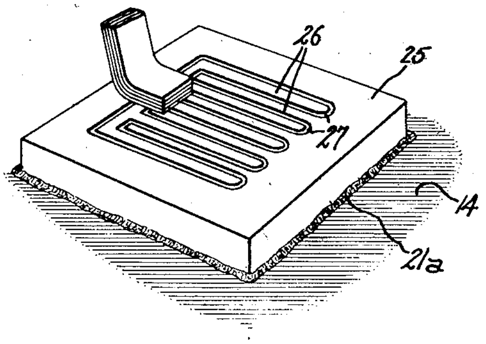
Figure 4:
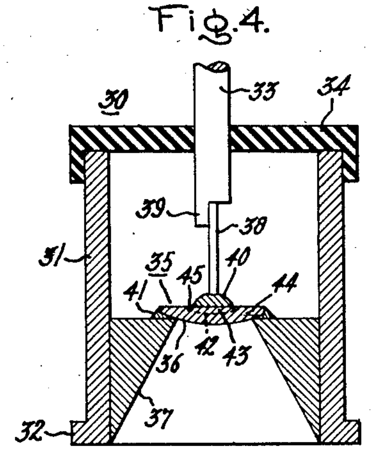
Figure 5:
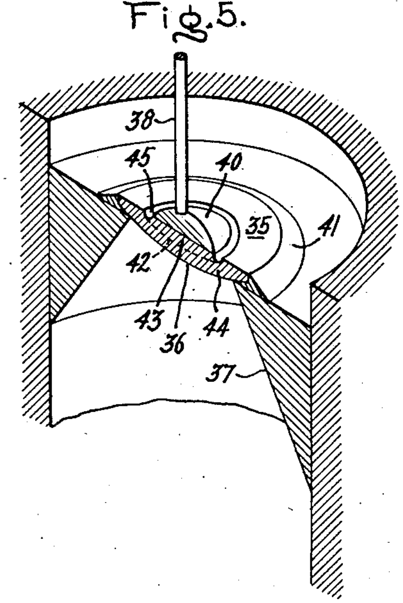

The novel features which I believe to be characteristic of my invention are set forth in the appended claims; the invention itself, however, together with further objects and advantages thereof may be better understood by referring to the following description taken in connection with the accompanying drawings in which Fig. 1 is a sectional view of a photocell embodying one form of my invention. Fig. 2 is an enlarged view of the active P–N junction unit included in the photocell of Fig. 1; Fig. 3 is an enlarged view of a structural modification of a P–N junction unit such as might be used in the photocell of Fig. 1; Fig. 4 is a sectional view of another photocell embodying an alternative form of my invention; and Fig. 5 is an enlarged view showing details of the active P–N junction unit included in the photocell of Fig. 4.

Referring to Fig. 1, I have shown my invention in one form as comprising a photocell 10 having an outer cylindrical casing 11 composed of insulating material, such as hard rubber, Bakelite, or various plastics. Casing 11 supports at one end a light-directing means such as lens 12, and supports at its opposite end the active photosensitive element including the germanium P–N junction unit 13 and suitable connections thereto. In this type of photocell 10, the P–N junction unit 13 constitutes a flat germanium wafer 25, and the incident light is focused by lens 12 upon an exposed flat major face of wafer 25. It will be appreciated that lens 12 may be omitted and the casing 10 extended to act as a sighting tube which directs the incident light upon the exposed surface of germanium wafer 25. Germanium wafer 25 contains the P–N junction and is supported upon a conductive disc or plug 14, preferably composed of a material such as fernico which is an iron, nickel, cobalt alloy having substantially the same coefficient of thermal expansion as germanium. A terminal conductor 15 is electrically connected in any suitable manner, such as by soldering, to plug 14. A second terminal conductor 16 is inserted through the side of casing 10 and has a small connector strip 17 attached by such means as spot welding to a lip 18 protruding from its internal end. Connector strip 17 is preferably flexible, and may conveniently be several layers of metal foil; and is electrically connected to the light-receiving surface of P–N junction unit 13.

In Fig. 2, I have shown the details of the P-N junction unit 13. As mentioned above, unit 13 comprises a thin wafer 25 of germanium having non-critical length and width dimensions such as ¼ inch. The thickness dimension $t$, however, should be no greater than .050 inch and preferably no less than .005 inch. The upper light-exposed surface of wafer 25 is covered by a very thin film 20 of a conduction carrier inducing impurity. Impurity film 20 may be deposited on wafer 25 by such means as evaporation or sputtering. It is desirable to polish and etch the surface of wafer 13 before the film is deposited thereon. Any deposits of film 20 upon the side edges of wafer 25 which might short-circuit the P-N junction are removed by grinding or etching. The film is thus confined to the upper surface of wafer 25 and should have a uniform thickness preferably no greater than 4,000 angstroms, with better results when the film thickness is in the neighborhood of 1,000 angstroms. It will be understood that the thickness of film 20 is greatly exaggerated in Fig. 2. The type of impurity selected for film 20 depends upon the conduction characteristics of the germanium selected for wafer 25. If the germanium initially comprising wafer 25 is N-type, then the impurity film should constitute an acceptor impurity such as aluminum, gallium, or indium, with best results ordinarily obtained when indium is used. Conversely, if P-type germanium is employed for wafer 25, the impurity film 20 should be selected from the class known as donors, such as antimony, phosphorus, and arsenic, with antimony preferable. If wafer 25 is neither predominantly N-type nor P-type, i. e., is composed of extremely pure or impurity-balanced "intrinsic germanium," then impurity film 20 may comprise either an acceptor or a donor impurity. Techniques for depositing such thin films of these impurity elements are well-known to the art and will not be further described here.

If wafer 25 constitutes N-type germanium, it is also preferable, although not absolutely necessary, that the opposite major face of wafer 25 be in conductive relation with, such as by being mounted upon, a plate 21 composed of a donor impurity element, preferably antimony. Conversely, if wafer 25 comprises P-type germanium, it is preferable that wafer 25 be mounted upon a plate 21 composed of an acceptor impurity element such as indium. If wafer 25 is composed of "intrinsic germanium," then it is essential that an impurity element, such as represented by plate 21, capable of inducing conduction carriers of opposite sign to that provided by impurity film 20, be brought into conductive relation with the bottom surface of wafer 25.

The impurity element comprising plate 21 is partially alloyed and diffused to a limited depth into the bottom major surface region of wafer 25 by a suitable application of heat. The extent and depth of diffusion is not critical as long as the impurity penetration does not extend across the entire thickness of wafer 25. The temperature and time required to effect this limited impurity diffusion will be more fully described hereinafter in connection with the formation of a P-N junction 22. Plate 21 is soldered to plug 14 and functions to furnish or absorb electrons, as the case may be, so that good conduction of a predetermined type may be established between the wafer and the terminal conductor 15. In an alternative arrangement illustrated in Fig. 3, it has been found convenient to employ a layer of solder 21*a* containing the desired impurity element in place of plate 21 as a means for directly mounting the wafer 25 upon the conductive plug 14. With N-type germanium for wafer 25, a solder 21*a* comprising, for example, 85% lead and 15% antimony, may be employed with a temperature of 250° C. to secure the wafer 25 to plug 14. A similar solder 21*a* including indium instead of antimony may be used with a P-type germanium wafer 25. The requisite good conductive contact, resulting from a very slight alloying and diffusion of the impurity into the wafer 25, is achieved by the heat and time required to carry out the soldering operation.

Wafer 25 may be mounted upon plate 21, or upon plug 14 through the medium of solder 21*a*, either before, after, or coincident with the formation of the P-N junction 22 within the wafer 25 immediately beneath impurity film 20. The P-N junction may be formed by effecting a diffusion of the impurity film into the germanium wafer 25 to a depth of penetration preferably less than .001 inch. With indium as the impurity film 20, a proper diffusion depth may be produced by heating the unit at from 400° to 600° C. for approximately one-half hour. With antimony as the impurity film 20, a similar heating period at a temperature of about 650° C. is suitable. An alloying action normally accompanies the diffusion but the deepest penetration is evidently produced by the diffused impurities and the P-N junction 22 formed at the limit or boundary of the diffused impurity penetration. The formation of P-N junction 22 is preferably carried out in an atmosphere, such as pure argon, chemically inactive with the impurity involved. For this reason, the diffusion of film 20 into wafer 25 is preferably accomplished by a separate heating cycle before the wafer 25 is mounted on plug 14. The diffusion of the impurity comprising plate 21 into the opposite major face of wafer 25 may also be achieved by a similar heating cycle. The temperatures employed to form the P-N junction 22 as well as to effect the diffusion of plate 21 or impurity solder 21*a* depend to a large extent upon the specific impurities involved. The temperatures, for example, at which diffusion into germanium occurs for practically all of the known "acceptor" and "donor" impurity elements lie within a range of 200° to 700° C. In general, the lower limit of temperature to be applied with any particular impurity element depends upon the temperature at which that element begins to wet germanium in the sense that a discernable degree of penetration begins. With indium, for example, this temperature is in the neighborhood of 250°, while the wetting temperature of antimony, however, is in the neighborhood of 600°. The upper limit of temperature, on the other hand, is determined largely by the temperature at which germanium begins to melt, usually around 950° C. Temperatures above 800° are not convenient, however, due to the difficulty of controlling the rate of impurity diffusion at these temperatures. The temperature and time required to effect the desired degree of impurity penetration can easily be determined by a few preliminary tests or by reference to known chemical and physical texts which disclose the diffusion properties of the various elements concerned. In general, the longer the time, the deeper the impurity penetration; and the higher the temperature, the greater the depth and concentration of impurities alloyed or diffused into the germanium.

One convenient way to determine the location of the P-N junction 22 in units produced by such preliminary tests is to cut the junction unit at a sharp angle along its thickness dimension and to move a hot metallic probe along the exposed angular side of the wafer until the deflection of a galvanometer in series with the probe reverses direction; the point of null deflection indicating the location of the P-N junction. This probe test is based upon the presence of a thermocouple between the probe and the germanium surface whereby a thermoelectric voltage of one polarity is produced between the hot probe and P-type germanium, while a thermoelectric voltage of opposite polarity is produced with N-type germanium. The methods of producing P-N junctions by this diffusion technique form a portion of the subject matter of my above-mentioned application, Serial No. 187,490, and are described in further detail therein.

Since the impurity film 20 is uniform and the entire wafer is subjected to a uniform heating cycle, the P-N junction 22 appears as an internal layer very close to the light-exposed surface of film 20. Due to the penetration of impurity film 20 into the surface region of germanium wafer 25 during the formation of the P-N junction, very little of the film, if any, remains on the surface. On one side of this P-N junction layer 22 is a region 23 of germanium, either N-type or P-type depending upon the initial conduction characteristics of wafer 13, or in the case of initial "intrinsic germanium" upon the conduction characteristics induced by the diffusion of the impurity plate 21 or solder 21*a*. Upon the opposite side of junction 22 is a very thin layer region 24 less than .001 inch thick, heavily impregnated with the impurity comprising film 20 and having an opposite sign conduction characteristic than region 23. Region 24 is located between the P-N junction 22 and the unabsorbed portion, if any, of film 20. Connector strip 17 is connected in electrically conductive relation with this heavily impregnated region 24 or with the remainder of impurity film 20, as illustrated.

When incident light is directed upon the upper surface of wafer 25, the light passes through any remainder of film 20 and the region 24 to impinge upon the P-N junction 22; and produces a photoelectric voltage between the terminal conductors 15 and 16. If an electric current is supplied through the P-N junction unit by means of an external source connected in series with an impedance to conductors 15 and 16, then the incident light may be employed to control the magnitude of the current flowing in this external circuit, and the voltage developed across the impedance may be varied accordingly. It will be appreciated that the P-N junction unit 13 also comprises an asymmetrically conductive device such that rectification of an alternating current in this circuit may be simultaneously accomplished. It has been found that the photoelectric effect of such P-N junction units is greater when the current is flowing in the reverse or backward direction, rather than in the forward or easy-flow direction.

Referring now to Fig. 3, I have shown an alternative electrode structure for the P-N junction unit 13 wherein the impurity element is deposited not as a complete film, but rather as a grid, preferably in the form of parallel bars 26 as illustrated. The thickness of this grid is of the same order of magnitude as film 20 and may be deposited upon the surface of wafer 25 in the same manner, such as by evaporation or sputtering, and the deposition of the impurity is restricted to the desired areas by means of a suitable mask (not shown) which is constructed to cover the surface regions of wafer 25 from which the impurity film is to be excluded. After the film is deposited in the desired grid form, the mask is removed and the P-N junction formed by a suitable heating cycle in the same manner as described in connection with Figs. 1 and 2. After the junction is formed, the grid-containing surface of the unit is preferably etched by a chemical or electrolytic etchant to remove any surface impurities and prevent short circuiting of the photoelectric voltage where the P-N junction meets the surface of wafer 25 around the edges of bars 26. Small troughs 27 are generally formed adjacent the edges of bars 26 by the etching process. The advantage of the arrangement of Fig. 3 is that the small total area of the sensitive P-N junction lessens the possibility of "faults" or insensitive regions in the P-N junction which tend to reduce the overall sensitivity of the unit.

It will be appreciated that with a P-N junction unit such as illustrated in Figs. 2 and 3, the incident light must pass only through a very slight thickness of material before it reaches the P-N junction 22. Due to the alloying and diffusion of film 20 during the formation of the P-N junction, the impurity film, if present, is much less than the initial 1,000 angstroms thick and the P-N junction 22 is less than .001 inch beneath the surface of wafer 25. Consequently, there is practically no absorption of any of the light rays before they impinge upon the P-N junction to give the desired photoelectric effect; and the unit is responsive to the entire range of the light spectrum, including the infra-red and ultra-violet light.

Referring now to Fig. 4, I have shown an alternative form of my invention embodied in a second photocell 30. Photocell 30 is shown as comprising an outer metallic cylindrical casing 31 having an annular collar 32 at its lower end which comprises a plug-in type terminal connection for one side of the photoelectric element; a conductor 33 inserted through an insulating cap 34 comprising the other terminal conductor for the photocell. A P-N junction unit 35 best seen in Fig. 5 comprising a germanium wafer 36 preferably circular, as shown, is supported by means of a funnel-shaped conductive plug 37 near the end of the photocell opposite the insulating cap 34. Wafer 36 may have a thickness between .005 inch and .050 inch and a non-critical diameter in the neighborhood of ½ inch. The funnel-shaped plug 37 functions to admit and direct light upon an exposed under-surface of wafer 36, which under-surface is preferably made spherical by such means as grinding or etching to act as a lens in a manner to be explained hereinafter. The plug 37 completely surrounds wafer 36 and is preferably hermetically sealed in good conductive relation therewith. A connector strip 38 is connected between a lip 39 on conductor 33 to a conduction carrier inducing impurity preferably in the form of a drop or dot 40 centrally located on the upper surface of wafer 36 internal the photocell 30. The upper surface of the P-N junction unit 35 is preferably etched, producing trough 45, in order to remove any surface-contamination or conductive impurities which may short circuit an internal P-N junction 42 where it meets the upper surface of wafer 36 around the edges of dot 40. An impurity 41 capable of inducing conduction carriers of opposite sign to that produced by impurity drop 40, and preferably in the form of a solder, is secured around the circumferential lower surface region of wafer 36. Impurity 41 functions to fasten the wafer in good conductive relation to plug 37 and to aid in the donation or absorption of electrons in the P-N junction unit in the same manner as plate 21 or solder 21*a* of photocell 10.

The impurity drop 40 may also conveniently be in the form of a solder and a P-N junction 42 is formed beneath the dot by effecting a diffusion of the impurity into the wafer 36 by a suitable heating cycle in the manner described above in connection with photocell 10. In photocell 30, however, it is not necessary that the P-N junction be formed at a depth of less than .001 inch beneath the surface of the wafer as was the case in photocell 10. In fact, for most applications, it is preferable that the heating time or temperatures be somewhat greater than those employed in producing the P-N junction units of photocell 10 so that the P-N junction will be formed closer to the exposed under-surface of wafer 36 such as, for example, at a maximum depth of .005 inch with a wafer having a maximum thickness of .015 inch. Due to the uniform rate of diffusion of the impurity comprising drop 40 in all directions during the formation of the P-N junction, a centrally located surface region 43 heavily impregnated with impurity 40 is produced in wafer 36 beneath drop 40, and the junction 42 is in the form of a spherical segment layer centrally located between the boundary limit of region 43 and a remainder region 44 of the wafer 36. The under-surface of wafer 36 is preferably also made spherical to act, by virtue of its high index of refraction, as a convex lens concentrating the incident light upon this centrally located internal P-N junction layer 42. Because of the light-directing properties of funnel-shaped plug 37 and the light concentrating action of the lens-shaped wafer 36 itself, photocell 30 can be made sensitive to light of relatively low intensity.

A P-N junction unit formed by a wafer having a thickness of .020 inch and a P-N junction formed approximately .005 inch below the impurity dot 40 was found to pass 20 milliamperes "dark" current in the difficult flow direction with 15 volts across the unit; which current raised to 30 milliamperes when illuminated by a 60-watt tungsten lamp at a distance of 1.5 inches. The light emitted from a tungsten lamp is, of course, largely infra-red. Due to the higher absorptivity of germanium to light in the visible and ultra-violet range than in the infra-red range, photocell 30 is much more sensitive to infra-red light than the remainder of the light spectrum. Assuming that the P-N junction is formed at a depth of .005 inch, then a wafer 36 having a thickness in the neighborhood of .015 inch will produce very high attenuation of all light except the infra-red.

In Fig. 5, I have indicated impurity drop 40 as comprising indium, and the circumferential impurity solder 41 as comprising antimony. The critical surface region 43 of wafer 36 adjacent impurity drop 40 is thus P-type while the region 44 adjacent impurity solder 41 is N-type. These conduction carrier inducing impurities as well as their respectively adjacent germanium regions may, of course, be reversed in position, and other acceptor and donor impurities may be respectively substituted for the indium and antimony shown.

It will thus be seen that I have provided a photocell in which the photosensitive P-N junction unit has an overall thickness not greater than .050 inch and is in the form of a sandwich having along its thickness dimension a P-type region, an N-type region and an intermediate P-N junction layer or region. Separate conductors are respectively connected to the N-type and P-type regions either directly or through impurity films or layers such as film 20, plate 21, solder 21*a*, drop 40 or solder 37, which may serve not only to impregnate the wafers 13 or 35 during the formation of the P-N junction, but also to provide improved electrical contact between the impurity-impregnated region of wafers 25 or 35 and their associated terminal conductors 15, 16, and 32, 33. The incident light is transmitted through one of the impurity-impregnated regions to impinge upon the internal P-N junction from a direction substantially perpendicular to the plane of the junction. The region 35 through which the light is transmitted may, as illustrated by photocell 10, be less than .001 inch thick to respond to the entire light spectrum, or may, as illustrated by photocell 30, be several mils thick to respond to narrower bands of the light spectrum approaching the infra-red. In addition, the impurity film 20 in photocell 10 may be employed to reduce the reflection properties of the light-receiving surface of the P-N junction unit. Moreover, the germanium wafer itself, as illustrated by photocell 30, may be shaped to act as a lens concentrating the incident light upon the internal P-N junction.

Although I have described above particular embodiments of my invention, many modifications can, of course, be made. It is to be understood that I intend to cover, by the appended claims, all such modifications falling within the true spirit and scope of my invention.

What I claim as new and desire to secure by Letters Patent of the United States is:

1. A photosensitive device comprising a germanium wafer having a thickness not greater than .050 inch and having along its thickness dimension a P-type region, an N-type region, and an intermediate P-N junction, separate conductors connected to a substantial area of said P- and N-type regions respectively, and means for directing light through one of said regions to impinge upon said P-N junction from a direction substantially perpendicular to the plane of said junction, the region through which light is directed being less than .001 inch thick.

2. A photocell comprising a germanium wafer having a thickness not greater than .050 inch, said wafer having a surface region impregnated with a predetermined sign conduction carrier inducing impurity, the remainder of said wafer having conduction characteristics of an opposite sign with a P-N junction intermediate said surface region and the remainder of said wafer, a first conductor connected to said surface region, and a second conductor connected to said wafer at a point remote from said surface region, said surface region having a thickness less than .001 inch thick, and means for directing light through said surface region to impinge upon said P-N junction from a direction substantially perpendicular to the plane of said junction.

3. A photocell comprising a germanium wafer having a thickness not greater than .050 inch and having along its thickness dimension a first region containing a diffused positive conduction carrier inducing impurity, a second region having a diffused negative conduction carrier inducing impurity, and an intermediate P-N junction layer, separate conductors connected to said first and second regions respectively, and means for directing light through one of said regions to impinge upon said P-N junction from a direction substantially perpendicular to the plane of said junction.

4. A photocell comprising a germanium wafer having a thickness not greater than .050 inch and having along its thickness dimension a first region having a positive conduction carrier inducing impurity diffused therein, a second region having a negative conduction carrier inducing impurity diffused therein, and an intermediate P-N junction layer, separate conductors connected to said first and second regions respectively, and means for directing light through one of said regions to impinge upon said P-N junction from a direction substantially perpendicular to the plane of said junction, the region through which light is directed being less than .001 inch thick.

5. A photocell comprising an N-type germanium wafer having a thickness not greater than .050 inch, an acceptor impurity film located on a surface portion of said wafer, said impurity being alloyed and diffused into said wafer to a partial depth less than the entire thickness dimension to produce a P–N junction with the remainder of said wafer at the limit of diffused penetration of said impurity, a first conductor connected to said impurity film, a second conductor connected to the remaining N-type portion of said wafer, and means for directing light through said wafer to impinge upon said internal P–N junction from a direction substantially perpendicular to the plane of said junction.

6. A photocell comprising an N-type germanium wafer having a thickness not greater than .050 inch, a film of an acceptor impurity on one face of said wafer, said impurity being diffused into said wafer to a depth not greater than .001 inch to form with the remainder of said wafer a P–N junction at the limit of said diffused impurity penetration, a first conductor connected to said film, a second conductor connected to said wafer at a point remote from said film, and means for directing light through said film to impinge upon said P–N junction.

7. A photocell comprising a P-type germanium wafer having a thickness not greater than .050 inch, a donor impurity film located on a surface portion of said wafer, said impurity being diffused into said wafer and to a partial depth less than the entire thickness dimension to produce a P–N junction with the remainder of said wafer at the limit of diffused penetration of said impurity, a first conductor connected to said impurity film, a second conductor connected to the remaining P-type portion of said wafer, and means for directing light through said wafer to impinge upon said P–N junction from a direction substantially perpendicular to the plane of said junction.

8. A photocell comprising a P-type germanium wafer having a thickness not greater than .050 inch, a film of a donor impurity on one face of said wafer, said impurity being diffused into said wafer to a depth not greater than .001 inch to form with the remainder of said wafer a P–N junction at the limit of said diffused impurity penetration, a first conductor connected to said film, a second conductor connected to said wafer at a point remote from said film, and means for directing light through said film to impinge upon said P–N junction.

9. A photocell comprising a germanium wafer having a thickness not greater than .050 inch, an acceptor impurity on one face of said wafer and a donor impurity on an opposite face of said wafer, said acceptor and donor impurities being diffused into said wafer to form an intermediate P–N junction layer, separate conductors connected to said acceptor and donor impurities respectively, and means for directing light through said wafer to impinge upon said P–N junction layer from a direction substantially perpendicular to the plane of said junction layer.

10. A photocell comprising a germanium wafer having a thickness not greater than .050 inch, an acceptor impurity on one face of said wafer and a donor impurity on an opposite face of said wafer, said donor and acceptor impurities being diffused into said wafer to form an intermediate P–N junction layer, separate conductors connected to said acceptor and donor impurities respectively, and means for directing light through one of the impurity-diffused regions of said wafer to impinge upon said P–N junction layer from a direction substantially perpendicular to the plane of said junction layer, said P–N junction layer being located less than .001 inch beneath the surface of the region of said wafer through which light is directed.

11. A photosensitive device comprising a germanium wafer having a thickness not greater than .050 inch and having along its thickness dimension a P-type region, an N-type region and an intermediate P–N junction, the surface of one of said regions having a spherical shape whereby the region acts as a lens to focus light upon said P–N junction, and separate conductors connected to said P-type and N-type regions respectively.

12. A photosensitive device comprising a circular germanium wafer having a thickness no greater than .050 inch, said wafer having adjacent one face thereof, a centrally located region having predetermined sign conduction characteristics, the remainder of said wafer having an opposite sign conduction characteristic with a P–N junction located intermediate said central region and the remainder region of said wafer, the surface of said remainder region of said wafer having a spherical configuration whereby the region acts as a lens to focus light upon said P–N junction, a first conductor connected to said central surface region, and a second conductor connected to said remainder region.

WILLIAM C. DUNLAP, Jr.

References Cited in the file of this patent

UNITED STATES PATENTS

| Number | Name | Date |
|---|---|---|
| 2,504,628 | Benzer | Apr. 18, 1950 |
| 2,530,110 | Woodyard | Nov. 14, 1950 |
| 2,582,850 | Rose | Jan. 15, 1952 |